United States Patent
Hoshikawa et al.

(10) Patent No.: US 10,307,915 B2
(45) Date of Patent: Jun. 4, 2019

(54) INSPECTION METHOD

(71) Applicant: FUJI CORPORATION, Chiryu (JP)

(72) Inventors: Kazumi Hoshikawa, Toyohashi (JP); Kenji Shimosaka, Obu (JP); Daisuke Suzuki, Anjo (JP); Tadakatsu Ibe, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 134 days.

(21) Appl. No.: 15/318,685

(22) PCT Filed: Jul. 15, 2014

(86) PCT No.: PCT/JP2014/068759
§ 371 (c)(1),
(2) Date: Dec. 14, 2016

(87) PCT Pub. No.: WO2016/009491
PCT Pub. Date: Jan. 21, 2016

(65) Prior Publication Data
US 2017/0120459 A1 May 4, 2017

(51) Int. Cl.
*B25J 19/00* (2006.01)
*B25J 15/06* (2006.01)
(Continued)

(52) U.S. Cl.
CPC .......... *B25J 19/0095* (2013.01); *B25J 15/06* (2013.01); *B25J 15/0616* (2013.01); *B25J 19/00* (2013.01);
(Continued)

(58) Field of Classification Search
CPC ........ B25J 19/0095; B25J 19/00; B25J 15/06; B25J 15/0616; G01F 5/00; H05K 13/0408; H05K 13/08
See application file for complete search history.

(56) References Cited

U.S. PATENT DOCUMENTS

2002/0078734 A1* 6/2002 Williams ............... G01B 13/20
73/37

FOREIGN PATENT DOCUMENTS

JP 2004-103922 A 4/2004
JP WO 2013057843 A1 * 4/2013 ......... H05K 13/0408

OTHER PUBLICATIONS

International Search Report dated Sep. 30, 2014 in PCT/JP2014/068759 filed Jul. 15, 2014.

* cited by examiner

*Primary Examiner* — Manuel L Barbee
(74) *Attorney, Agent, or Firm* — Oblon, McClelland, Maier & Neustadt, L.L.P.

(57) ABSTRACT

An inspection method of a suction nozzle. Air flow rates that flow in multiple reference pipes that have different sectional areas are measured. A proportionality factor between air flow rates and sectional areas of the reference pipes is calculated based on the measured air flow rates of the multiple reference pipes, and the sectional areas of the multiple reference pipes. An air flow rate in a suction nozzle that is an inspection target is measured. The sectional area of the suction nozzle is calculated based on the air flow rate of the suction nozzle and the calculated proportionality factor. The sectional area of the suction nozzle calculated in this manner is substantially fixed even when the pressure of air supplied from an air source fluctuates. The sectional area of the suction nozzle is proportional to the air flow rate that flows in an inner portion of the suction nozzle.

6 Claims, 4 Drawing Sheets

(51) Int. Cl.
*G01F 5/00* (2006.01)
*H05K 13/04* (2006.01)
*H05K 13/08* (2006.01)
(52) U.S. Cl.
CPC ........... *G01F 5/00* (2013.01); *H05K 13/0409* (2018.08); *H05K 13/082* (2018.08)

INSPECTION METHOD

TECHNICAL FIELD

The present application relates to an inspection method that inspects a suction nozzle which picks up a target object using air suction.

BACKGROUND ART

Since the suction nozzle picks up the target object using air suction, an appropriate suction force is necessary. Since an appropriate suction force may not be obtained in a suction nozzle in which a blockage or the like occurs, as an inspection of the suction nozzle, there is an inspection (hereinafter sometimes referred to as "air flow rate inspection") of whether an appropriate amount of air is flowing in an inner portion of the suction nozzle. The patent literature below describes an embodiment of an air flow rate inspection.

PTL 1: JP-A-2004-103922

SUMMARY

According to the inspection method described in the patent literature above, it is possible to appropriately perform air flow rate inspection to an extent. However, during the air flow rate inspection, air is typically supplied from an air source, and measurement of the air flow rate is performed using this air; however, there are cases in which the pressure of the air supplied from the air source fluctuates greatly. In such cases, since the air flow rate that flows in the inner portion of the suction nozzle also fluctuates, there is a concern that the air flow rate inspection may not be appropriately performed. The present disclosure is made in consideration of such issues, and an object of the present disclosure is to appropriately perform the air flow rate inspection even in a case in which the pressure of the air supplied from the air source fluctuates greatly.

In order to solve the problem described above, an inspection method described in the present application is an inspection method for inspecting a suction nozzle that picks up a target object using air suction, the method including a reference pipe measurement step of measuring an air flow rate per unit time that flows in each of multiple reference pipes that have different sectional areas, a proportionality factor calculation step of calculating a proportionality factor between the air flow rates of the reference pipes and sectional areas based on the air flow rate of each of the multiple reference pipes which are measured in the reference pipe measurement step, and the sectional areas of the multiple reference pipes, a suction nozzle measurement step of measuring the air flow rate per unit time that flows in a suction nozzle which is an inspection target, and a sectional area calculation step of calculating a sectional area of the suction nozzle which is the inspection target based on the air flow rate which is measured in the suction nozzle measurement step, and the proportionality factor which is calculated in the proportionality factor calculation step.

In order to solve the problem described above, an inspection method described in the present application is an inspection method for inspecting a suction nozzle that picks up a target object using air suction, the method including a pressure adjustment step of adjusting a pressure of air which is supplied from a first air source to a set pressure, a flow rate adjustment step of adjusting a flow rate per unit time of air that flows inside an air flow path to a set amount using air of a pressure which is adjusted in the pressure adjustment step, an air source exchanging step of exchanging a first air source for a second air source that has greater pressure fluctuation than the first air source after adjustment of the flow rate of air by the flow rate adjustment step is completed, a first measurement step of measuring a flow rate per unit time of air that flows inside the air flow path after exchanging of air sources by the air source exchanging step is completed, a second measurement step of measuring a flow rate per unit time of air that flows inside the air flow path in a state in which a suction nozzle which is an inspection target is connected to the air flow path, and an estimated flow rate calculation step of calculating a value, which is obtained by multiplying the flow rate per unit time which is measured in the second measurement step by a ratio of the flow rate per unit time which is measured in the first measurement step to the set amount, as an estimated flow rate.

ADVANTAGEOUS EFFECTS

In the inspection method described in the present application, the air flow rate per unit time that flows in each of the multiple reference pipes that have different sectional areas is measured. Next, a proportionality factor between the air flow rates and the sectional areas of the reference pipes is calculated based on the air flow rates of the multiple reference pipes that are measured, and the sectional areas of the multiple reference pipes. The air flow rate per unit time that flows in a suction nozzle that is an inspection target is measured. The sectional area of the suction nozzle that is the inspection target is calculated based on the air flow rate of the suction nozzle that is measured and the proportionality factor that is calculated. The sectional area of the suction nozzle that is calculated based on the air flow rate of the suction nozzle and the proportionality factor, as described later in detail, is substantially fixed even in a case in which a pressure of air supplied from an air source fluctuates. The sectional area of the suction nozzle is proportional to the air flow rate that flows in an inner portion of the suction nozzle. Therefore, by performing the air flow rate inspection using the sectional area of the suction nozzle that is calculated, even in a case in which the pressure of the air supplied from the air source fluctuates greatly, it becomes possible to appropriately perform the air flow rate inspection.

In the inspection method described, in the present application, the pressure of the air supplied from the first air source is adjusted to the set pressure. Next, the flow rate per unit time of the air that flows inside the air flow path is adjusted to the set amount using the air of the adjusted pressure. Subsequently, after the adjustment of the flow rate of the air is completed, the first air source is exchanged for the second air source that has greater pressure fluctuation than the first air source. After the exchanging of the air sources is completed, the flow rate per unit time of the air that flows inside the air flow path is measured. The flow rate per unit time of the air that flows inside the air flow path is measured in a state in which the suction nozzle that is the inspection target is connected to the air flow path. A value, which is obtained by multiplying an air flow rate per unit time of the air flow path in the state in which the suction nozzle is connected by a ratio of the air flow rate per unit time measured after the air sources are exchanged with respect to the set amount, is calculated as an estimated flow rate. The calculated estimated flow rate becomes the air flow rate when the air is being supplied from the first air source, that is, when the flow rate of the air that flows in the air flow path has substantially no fluctuation. Therefore, by performing the air flow rate inspection based on the estimated flow rate, even in a case in which the pressure of the air supplied from the air source fluctuates greatly, it becomes possible to appropriately perform the air flow rate inspection.

DETAILED DESCRIPTION

Figure 1:
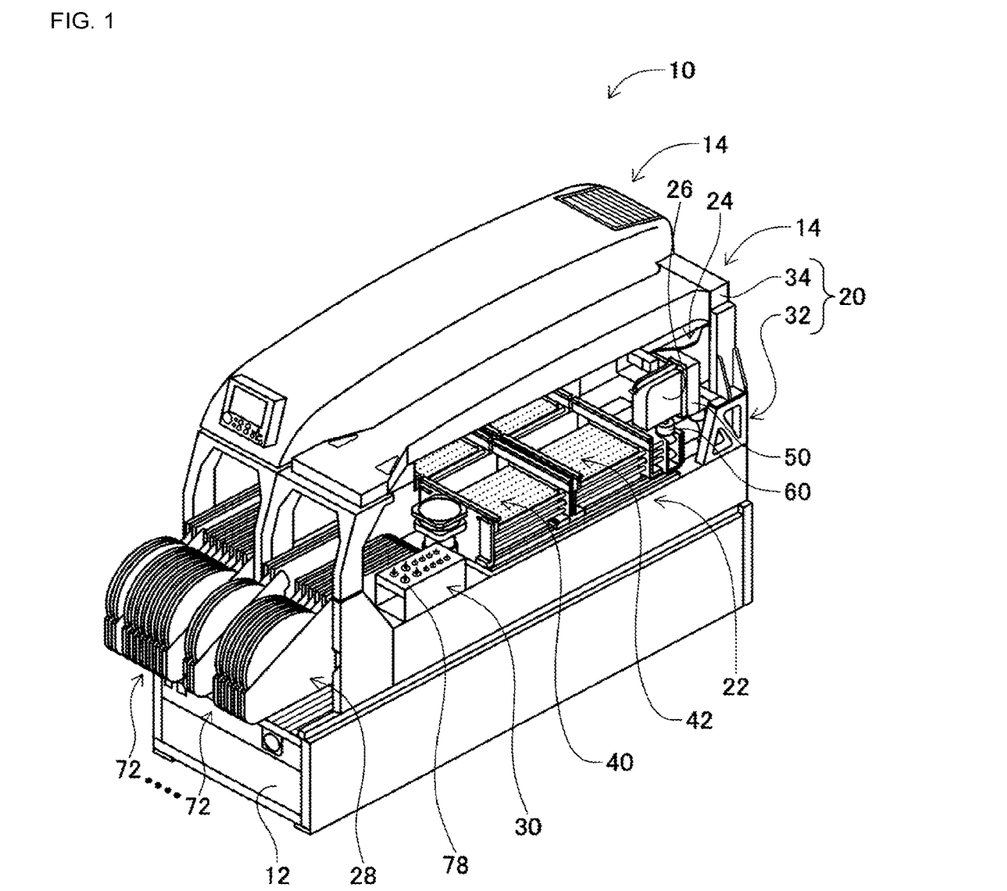
FIG. 1 is a perspective view illustrating an electronic component mounting device.

Hereinafter, detailed description will be given of an embodiment of the present disclosure with reference to the drawings as a mode for carrying out the present disclosure. Configuration of Electronic Component Mounting Device FIG. 1 illustrates an electronic component mounting device (hereinafter there are cases in which this is shortened to "mounting device") 10. Mounting device 10 includes a single system base 12, and two electronic component mounting machines (hereinafter, there are cases in which this is shortened to "mounting machine") 14 which are adjacent on system base 12. The direction in which the mounting machines 14 are lined up will be referred to as an X-axis direction, and a horizontal direction which is perpendicular to the X-axis direction will be referred to as a Y-axis direction.

Each of the mounting machines 14 is mainly provided with mounting machine main body 20, conveyance device 22, mounting head moving device (hereinafter, there are cases in which this is shortened to a "moving device") 24, mounting head 26, supply device 28, and nozzle station 30. Mounting machine main body 20 is formed of frame section 32, and beam section 34 that bridges over frame section 32.

Conveyance device 22 is provided with two conveyor devices 40 and 42. Two conveyor devices 40 and 42 are installed on frame section 32 to be parallel to each other and to extend in the X-axis direction. The two conveyor devices 40 and 42 convey circuit boards that are supported by conveyor devices 40 and 42 in the X-axis direction using an electromagnetic motor (not illustrated). The circuit board is held in a fixed manner at a predetermined position by a board holding device (not illustrated).

Moving device 24 is an XY robot-type moving device. Moving device 24 is provided with an electromagnetic motor (not illustrated) that causes slider 50 to slide in the X-axis direction, and an electromagnetic motor (not illustrated) that causes slider 50 to slide in the Y-axis direction. Mounting head 26 is attached to slider 50, and mounting head 26 is caused to move to any position above frame section 32 by the operation of the two electromagnetic motors.

Figure 2:
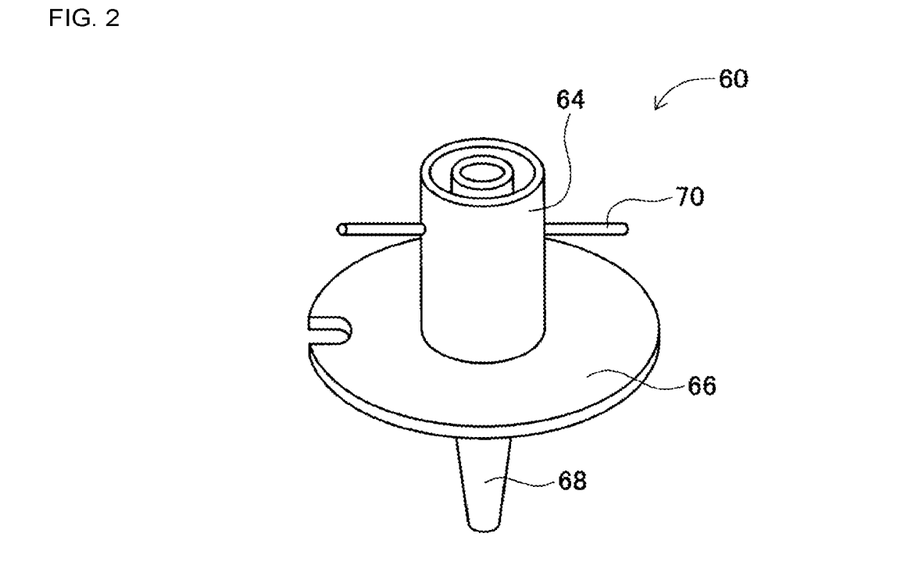
FIG. 2 is a perspective view illustrating a suction nozzle.

Mounting head 26 mounts electronic components onto the circuit board. Suction nozzle 60 is provided on the bottom end surface of mounting head 26. As illustrated in FIG. 2, suction nozzle 60 is formed of body cylinder 64, flange portion 66, suction pipe 68, and locking pin 70. Body cylinder 64 is cylindrically shaped, and flange portion 66 is fixed to protrude from the outer circumferential surface of body cylinder 64. Suction pipe 68 is a narrow pipe, and is held by body cylinder 64 to be capable of moving in an axial line direction in a state extending downward from the bottom end portion of body cylinder 64. Locking pin 70 is provided on the top end portion of body cylinder 64 so as to extend in the radial direction of body cylinder 64. Suction nozzle 60 is attached and detached to and from mounting head 26 in a single operation using locking pin 70.

Suction nozzle 60 is connected to a positive and negative pressure supply device (not illustrated) via a negative pressure air and positive pressure air passage. Each of the suction nozzles 60 picks up and holds an electronic component using negative pressure and releases the held electronic component using positive pressure. Mounting head 26 includes a nozzle lifting and lowering device (not illustrated) that lifts and lowers suction nozzle 60. Mounting head 26 changes the position of the electronic component which is held in the vertical direction using the nozzle lifting and lowering device.

Supply device 28 is a feeder-type supply device and, as illustrated in FIG. 1, is installed on the end portion of the front side of frame section 32. Supply device 28 includes tape feeders 72. Tape feeder 72 accommodates taped components in a wound state. The taped components are obtained by taping the electronic components. Tape feeder 72 feeds out the taped components using a feed device (not illustrated). Accordingly, feeder-type supply device 28 supplies the electronic components to the supplying position by feeding out the taped components.

Nozzle station 30 includes nozzle tray 78 that accommodates multiple suction nozzles 60. At nozzle station 30, the exchanging of a suction nozzle 60 attached to mounting head 26 with a suction nozzle 60 accommodated in nozzle tray 78, and the like is performed as necessary. Nozzle tray 78 is capable of being attached and detached to and from nozzle station 30, such that the collection of suction nozzles 60 that are accommodated in nozzle tray 78, the refilling of suction nozzles 60 to nozzle tray 78, and the like is able to be performed outside of mounting machine 14.
Mounting Work by Mounting Machine According to the configuration described above, in mounting machine 14, it is possible to perform the mounting work on the circuit board held by conveyance device 22 using mounting head 26. Specifically, according to the instructions of a control device (not illustrated) of mounting machine 14, the circuit board is conveyed to a working position, and at this position, is held in a fixed manner by the board holding device. Tape feeder 72 feeds out the taped components and supplies the electronic components to the supplying position on according to the instructions of the control device. Mounting head 26 moves above the supplying position of the electronic components and picks up and holds an electronic component using suction nozzle 60. Subsequently, mounting head 26 moves above the circuit board, and mounts the electronic component which is being held onto the circuit board.
Inspection of Suction Nozzle As described above, in mounting machine 14, an electronic component supplied by tape feeder 72 is picked up and held by suction nozzle 60, and then mounted onto the circuit board. Therefore, when a problem arises in suction nozzle 60, it is not possible to perform appropriate mounting work. In consideration of this, nozzle tray 78 is detached from nozzle station 30 of mounting machine 14, and inspection of suction nozzles 60 accommodated in nozzle tray 78 is performed in a nozzle management device.

Figure 3:
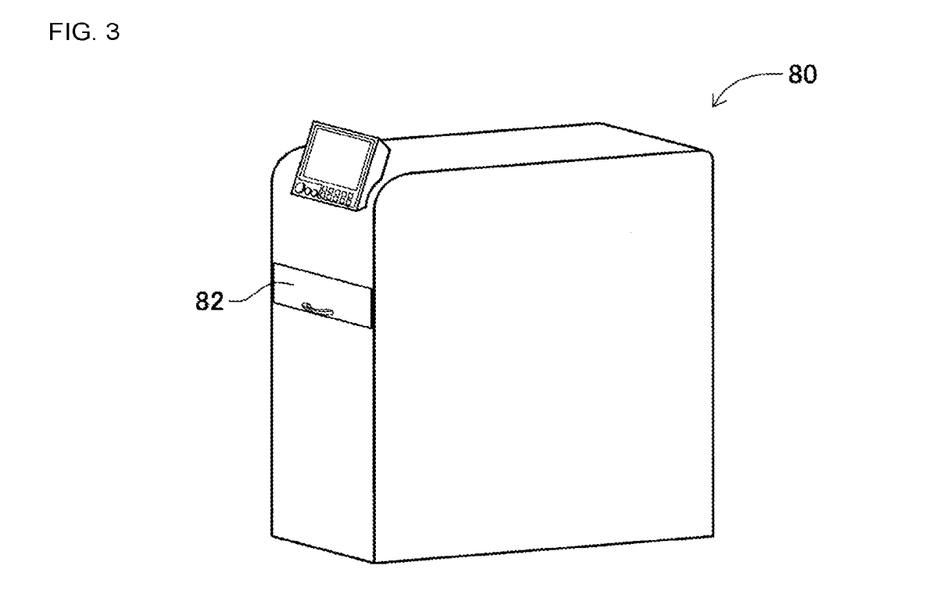
FIG. 3 is a perspective view illustrating a nozzle management device.

Specifically, as illustrated in FIG. 3, nozzle management device 80 is a substantially rectangular parallelepiped shape, and drawer 82 for storing nozzle tray 78 inside nozzle management device 80 or for removing nozzle tray 78 from nozzle management device 80 is provided in the front surface. Suction nozzles 60 stored in nozzle management device 80 are subjected to management and inspection in nozzle management device 80. During the inspection of a suction nozzle 60, inspection of the flow rate of the air that flows in the suction nozzle 60 is performed.

Figure 4:
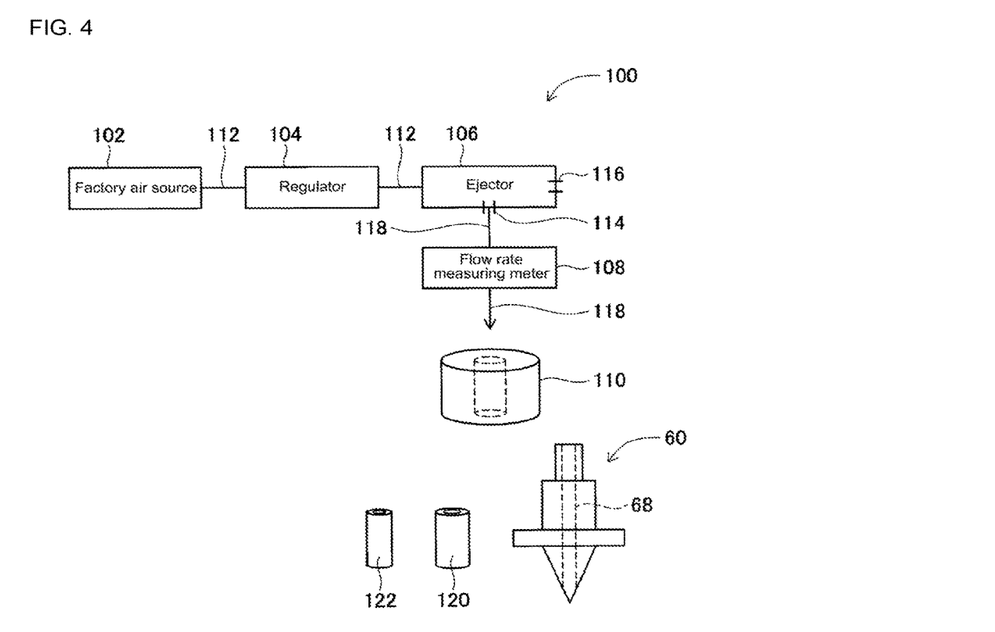
FIG. 4 is a schematic diagram illustrating a flow rate inspection device.

Specifically, as illustrated in FIG. 4, flow rate inspection device 100 that performs inspection of the air flow rate is provided with factory air source 102, regulator 104, ejector 106, flow rate measuring meter 108, and air joint 110. Factory air source 102 is the air source of flow rate inspection device 100, and supplies pressurized air to flow rate inspection device 100. However, factory air source 102 is also the air source of other devices inside the factory in which nozzle management device 80 is installed, and the pressure of the air which is supplied by the factory air source 102 fluctuates due to the supplying of air to the other devices and the like.

Regulator 104 is an adjustment valve that adjusts the pressure of the air, and is installed in pressurized air flow path 112 in which the air which is supplied from factory air source 102 flows. Accordingly, the air which is supplied from factory air source 102 is adjusted to a given pressure by regulator 104. Ejector 106 is a vacuum pump that depressurizes air using pressurized air, and is connected to pressurized air flow path 112. Accordingly, ejector 106 sucks air from vacuum port 114 and blows out air from exhaust port 116.

Depressurized air flow path 118 is connected to vacuum port 114, and air in depressurized air flow path 118 is sucked by ejector 106. Flow rate measuring meter 108 is installed in depressurized air flow path 118, and the flow rate per unit time of the air that flows inside depressurized air flow path 118 (hereinafter there are cases in which this is shortened to "air flow rate") is measured by flow rate measuring meter 108. Air joint 110 is connected to depressurized air flow path 118, and the flow rate of the air that flows inside suction nozzle 60 is measured by flow rate measuring meter 108 due to suction pipe 68 of suction nozzle 60 being connected to air joint 110.

When the flow rate of the air that flows inside suction nozzle 60 is measured, it is possible to determine whether the suction nozzle 60 is functioning correctly based on the measurement value. Specifically, when air is supplied to a suction nozzle 60 that is functioning correctly, since air passes through the inside of the suction nozzle 60, the air flow rate measured by flow rate measuring meter 108 is comparatively great. Meanwhile, when air is supplied to a suction nozzle 60 in which a blockage or the like has occurred, since air does not easily pass through the inside of the suction nozzle 60, the air flow rate which is measured by flow rate measuring meter 108 is comparatively small. Therefore, in a case in which the air flow rate measured by flow rate measuring meter 108 is greater than a predetermined amount, it is possible to determine that the suction nozzle 60 is functioning correctly, and in a case in which the air flow rate measured by flow rate measuring meter 108 is less than or equal to a predetermined amount, it is possible to determine that the suction nozzle 60 is faulty. However, as described above, since the pressure of the air which is supplied by factory air source 102, which is the air source of flow rate inspection device 100, fluctuates, there is a concern that the flow rate of the air that flows inside depressurized air flow path 118 will also fluctuate. Therefore, there is a concern that it is not possible to appropriately determine whether the suction nozzle 60 is functioning correctly using the air flow rate measured by flow rate measuring meter 108.

In light of this fact, in flow rate inspection device 100, the valid sectional area of suction nozzle 60 is estimated based on the air flow rate which is measured by flow rate measuring meter 108, and it is determined whether the suction nozzle 60 is functioning correctly using the valid sectional area of the suction nozzle 60 which is estimated. Specifically, first, the air flow rate that flows inside two reference pipes 120 and 122 is measured. The two reference pipes 120 and 122 have different valid sectional areas from each other, the valid sectional area of reference pipe 120 is $D_1$, and the valid sectional area of reference pipe 122 is $D_2$ ($D_1$). The valid sectional areas of suction nozzle 60 and reference pipes 120 and 122 are the minimum sectional areas of a path through which the air flows.

When the air flow rate that flows inside the two reference pipes 120 and 122 is measured, a proportionality factor of the air flow rate measured in relation to the valid sectional area of reference pipes 120 and 122 is calculated. Specifically, for example, in a case in which the air flow rate that flows inside reference pipe 120 is $L_1$, and the air flow rate that flows inside the reference pipe 122 is $L_2$ ($L_1$), a proportionality factor A is calculated according to the following equation.

$$A=(L_1-L_2)/(D_1-D_2)$$

Figure 5:
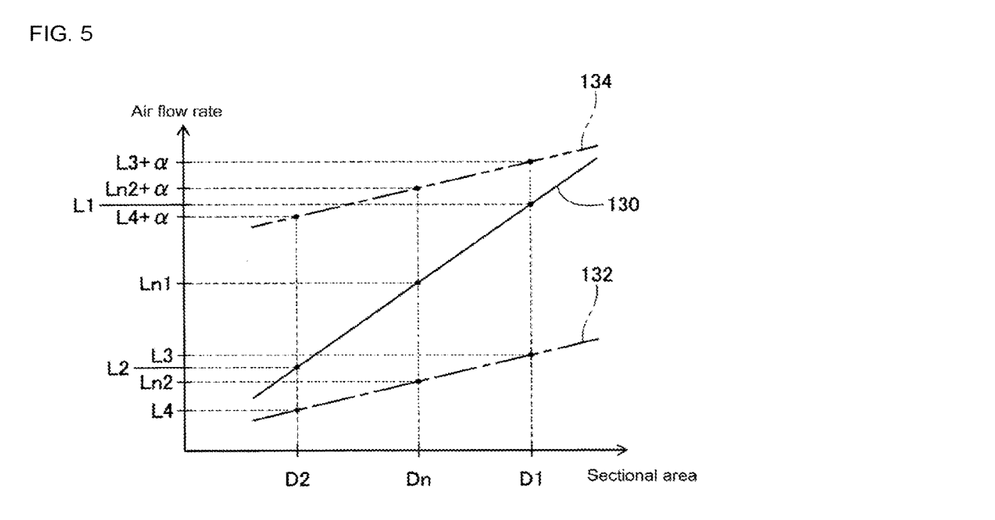
FIG. 5 is a graph illustrating the relationship between the sectional area of the suction nozzle and the flow rate of the air that flows in the inner portion of the suction nozzle.

When the proportionality factor A is calculated according to the procedure described above, the valid sectional area of the suction nozzle 60 is calculated based on the proportionality factor A and the air flow rate which flows inside the suction nozzle 60. Specifically, in a case in which the air flow rate that flows inside the suction nozzle 60 is $L_{n1}$, as illustrated in FIG. 5, $D_n$ is calculated as the valid sectional area of the suction nozzle 60 based on straight line 130 that has a gradient of the proportionality factor A.

For example, in a case in which the pressure of the air supplied from factory air source 102 fluctuates and the flow rate of the air that flows in depressurized air flow path 118 changes, the proportionality factor of the air flow rate in relation to the valid sectional area of reference pipes 120 and 122 changes. Specifically, for example, due to the air flow rate that flows in depressurized air flow path 118 changing, there is a case in which the air flow rate that flows inside reference pipe 120 becomes $L_3$ and the air flow rate that flows inside reference pipe 122 becomes $L_4$ ($L_3$). In such a case, a proportionality factor A' is calculated according to the following equation.

$$A'=(L_3-L_4)/(D_1-D_2)$$

In a case in which the air flow rate that flows inside the suction nozzle 60 is $L_{n2}$, $D_n$ is calculated as the valid sectional area of the suction nozzle 60 based on straight line 132 that has a gradient of the proportionality factor A'. In this case, as illustrated in FIG. 5, straight line 132 that has a gradient of the proportionality factor A' is different from straight line 130 that has a gradient of the proportionality factor A; however, since the ratio of $(L_3-L_{n2}):(L_{n2}-L_4)$ is the same as the ratio of $(L_1-L_{n1}):(L_{n1}-L_2)$, the valid sectional area $D_n$ calculated based on straight line 132 that has a gradient of the proportionality factor A' is the same as the valid sectional area $D_n$ calculated based on straight line 130 that has a gradient of the proportionality factor A. In other words, even in a case in which the pressure of the air supplied from factory air source 102 fluctuates and the proportionality factor of the air flow rate in relation to the valid sectional area of reference pipes 120 and 122 changes, $D_n$ is calculated as the valid sectional area of the suction nozzle 60.

For example, in a case in which the measurement value of the air flow rate is offset by a predetermined number α, the air flow rate which flows inside the reference pipe 120 becomes $L_3+α$, and the air flow rate which flows inside the reference pipe 122 becomes $L_4+α$. In such a case, a proportionality factor is calculated according to the following equation, and the proportionality factor becomes the same as the proportionality factor A' described above.

$$A'=\{(L_3+α)-(L_4+α)\}/(D_1-D_2)=(L_3-L_4)/(D_1-D_2)$$

However, even if straight line 134 of a case in which the measurement value of the air flow rate is offset has the same proportionality factor as straight line 132 of before the offset, the intercept is different. In such a case, the air flow rate which flows inside the suction nozzle 60 is also offset by the predetermined number α, and becomes $L_{n2}+α$. In this case, since the ratio of $\{(L_3+α)-(L_{n2}+α)\}:\{(L_{n2}+α)-(L_4+α)\}$ is the same as the ratio of $(L_3-L_{n2}):(L_{n2}-L_4)$, the valid sectional area which is calculated based on straight line 134 becomes $D_n$. In other words, even in a case in which the measurement value of the air flow rate is offset, $D_n$ is calculated as the valid sectional area of the suction nozzle 60.

In this manner, in flow rate inspection device 100, even in a case in which pressure fluctuation arises in the air which is supplied from factory air source 102, and in a case in which the measurement value of the air flow rate is offset, it is possible to appropriately calculate the valid sectional area of the suction nozzle 60. The valid sectional area of the suction nozzle 60 is proportional to the air flow rate that flows inside the suction nozzle 60 as illustrated in FIG. 5. In other words, when the air is supplied to a suction nozzle 60 that is functioning correctly, since a comparatively large amount of air flows inside the suction nozzle 60, the valid sectional area of the suction nozzle 60 is comparatively great. Meanwhile, when the air is supplied to the suction nozzle 60 in which a blockage or the like has occurred, since only a small amount of air flows inside the suction nozzle 60, the valid sectional area of the suction nozzle 60 is comparatively small. Therefore, in a case in which the valid sectional area of the suction nozzle 60 calculated is greater than a predetermined sectional area, it is determined that the suction nozzle 60 is functioning correctly, and in a case in which the valid sectional area of the suction nozzle 60 calculated is less than or equal to the predetermined sectional area, it is determined that the suction nozzle 60 is faulty. Accordingly, even in a case in which pressure fluctuation arises in the air which is supplied from factory air source 102, it becomes possible to appropriately determine whether the suction nozzle 60 is functioning correctly.

A step of measuring the air flow rate that flows inside reference pipes 120 and 122 using flow rate measuring meter 108 is an example of a reference pipe measurement step. A step of calculating the proportionality factor of the air flow rate in relation to the valid sectional area of reference pipes 120 and 122 based on the air flow rate that flows inside reference pipes 120 and 122 measured in the reference pipe measurement step, and the valid sectional area of reference pipes 120 and 122 is an example of a proportionality factor calculation step. A step of measuring the air flow rate that flows inside the suction nozzle 60 using flow rate measuring meter 108 in a state in which suction pipe 68 of the suction nozzle 60 is connected to air joint 110 is an example of a suction nozzle measurement step. A step of calculating the valid sectional area of the suction nozzle 60 based on the proportionality factor calculated in the proportionality factor calculation step and the air flow rate that flows inside the suction nozzle 60 measured in the suction nozzle measurement step is an example of a sectional area calculation step.

Second Embodiment

In flow rate inspection device 100 of the embodiment described above, it is determined whether the suction nozzle 60 is functioning correctly based on the valid sectional area of the suction nozzle 60; however, in the flow rate inspection device of the second embodiment, it is determined whether the suction nozzle 60 is functioning correctly based on the air flow rate that flows inside the suction nozzle 60. Hereinafter, description will be given of the inspection method of the suction nozzle 60 that uses flow rate inspection device 150 of the second embodiment illustrated in FIG. 6. Flow rate inspection device 150 of the second embodiment is configured in the same manner as the flow rate inspection device 100 described above, except for compressor 152, pressure gauge 154, and speed controller 156. Therefore, for elements of the same configuration as flow rate inspection device 100, the same reference signs as those of flow rate inspection device 100 will be used, and description will be omitted.

Figure 6:
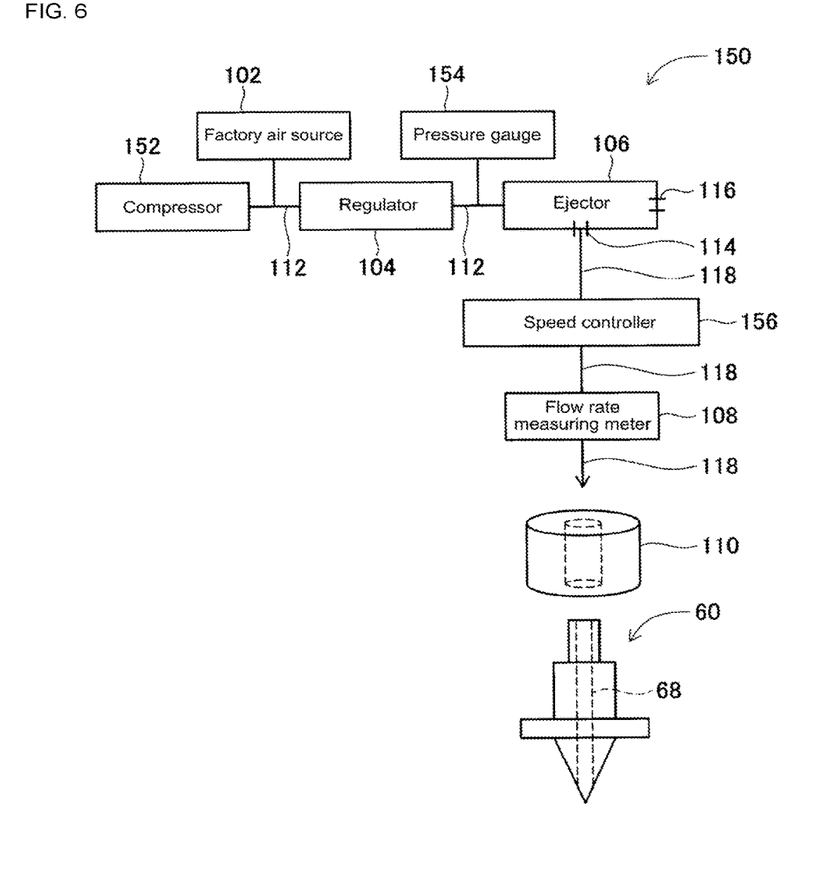
FIG. 6 is a schematic diagram illustrating a flow rate inspection device of a second embodiment.

As illustrated in FIG. 6, in flow rate inspection device 150, factory air source 102 and compressor 152 are provided as air sources, and pressurized air is supplied to pressurized air flow path 112 from either one of factory air source 102 and compressor 152. Compressor 152 supplies air to only flow rate inspection device 150, and unlike factory air source 102, there is little fluctuation in the air which is supplied from compressor 132.

Pressure gauge 154 is installed between regulator 104 and ejector 106 of pressurized air flow path 112, and detects the pressure of the air which is supplied to ejector 106. Accordingly, it becomes possible to adjust the pressure of the air supplied to ejector 106 to a predetermined pressure using regulator 104. Speed controller 156 is installed between ejector 106 and flow rate measuring meter 108 of depressurized air flow path 118, and adjusts the flow rate of the air that flows in depressurized air flow path 118.

In flow rate inspection device 150 of the structure described above, first, air is supplied from compressor 152 to pressurized air flow path 112. Accordingly, air that has little pressure fluctuation is supplied to pressurized air flow path 112. The pressure of the air supplied to ejector 106 is adjusted to a set pressure by regulator 104. Subsequently, the flow rate of the air that flows in depressurized air flow path 118 is adjusted to a set amount by speed controller 156. When the air flow rate is adjusted by speed controller 156, the suction nozzle 60 is not connected to air joint 110. In other words, the flow rate of the air that flows in depressurized air flow path 118 that is in an open state (hereinafter, there are cases in which this is denoted as "adjustment time open flow rate") is adjusted to a set amount.

When the adjustment time open flow rate is set to the set amount, the air source of flow rate inspection device 150 is changed from compressor 152 to factory air source 102. In other words, the air is supplied from factory air source 102 to pressurized air flow path 112. After the air source is changed, the flow rate of the air that flows in depressurized air flow path 118 is measured by flow rate measuring meter 108. When the air flow rate is measured by the flow rate measuring meter 108 after the air source is changed, the suction nozzle 60 is not connected to air joint 110. In other words, after the air source is changed, the flow rate of the air that flows in depressurized air flow path 118 which is in an open state (hereinafter, there are cases in which this is denoted as "post-air source change open flow rate") is measured.

Next, suction pipe 68 of the suction nozzle 60 is connected to depressurized air flow path 118, and the air flow rate that flows inside the suction nozzle 60 is measured by flow rate measuring meter 108. The measurement value of the air flow rate that flows inside the suction nozzle 60 (hereinafter, there are cases in which this is denoted as "nozzle measurement value") is adjusted based on the adjustment time open flow rate and the post-air source change open flow rate.

Specifically, when the nozzle measurement value is measured, the air is supplied from factory air source 102 to pressurized air flow path 112. Therefore, even in a case in which the air flow rate that flows in depressurized air flow path 118 fluctuates due to the pressure fluctuation of the air supplied to pressurized air flow path 112, and the same air flow rate of the suction nozzle 60 is measured for the nozzle measurement value, there is a concern that the nozzle measurement value will be different every time the measurement is performed. In other words, there is a concern that whether the suction nozzle 60 is functioning correctly may not be appropriately determined using the nozzle measurement value. Therefore, the nozzle measurement value $L_n$ is adjusted according to the following equation, and the post-adjustment air flow rate L is calculated.

$$L=(L_0/L_s)\times L_n$$

$L_s$ is the adjustment time open flow rate, and $L_0$ is the post-air source change open flow rate.

The air flow rate L calculated according to the equation described above becomes the air flow rate when the air is being supplied from compressor 152 to pressurized air flow path 112, that is, when there is substantially no fluctuation in the air flow rate of depressurized air flow path 118. Accordingly, even in a case in which the nozzle measurement value $L_n$ that is different due to the pressure fluctuation of the air supplied to pressurized air flow path 112 is measured, the air flow rate L calculated according to the equation described above is substantially fixed. Accordingly, it becomes possible to appropriately determine whether the suction nozzle 60 is functioning correctly using the calculated air flow rate L.

A step in which the pressure of the air supplied to compressor 152 is adjusted by regulator 104 is an example of a pressure adjustment step. A step in which the adjustment time open flow rate $L_s$ is adjusted by speed controller 156 is an example of a flow rate adjustment step. A step in which the air source of flow rate inspection device 150 is changed from compressor 152 to factory air source 102 is an example of an air source exchanging step. A step in which the post-air source change open flow rate $L_0$ is measured by flow rate measuring meter 108 after the changing of the air source is an example of a first measurement step. A step in which the nozzle measurement value $L_n$ is measured by flow rate measuring meter 108 after the measurement of the post-air source change open flow rate is an example of a second measurement step. A step in which the air flow rate L is calculated according to the equation described above is an example of an estimated flow rate calculation step.

Note that, the present disclosure is not limited to the embodiments described above, and it is possible to carry out the present disclosure in various modes subjected to various modifications and improvements based on the knowledge of a person skilled in the art. Specifically, for example, in the embodiments described above, the air flow rate when air is sucked from suction pipe 68 of the suction nozzle 60 is measured; however, it is possible to measure the air flow rate when air is blown into suction pipe 68.

In the first embodiment described above, the sectional area of the suction nozzle 60 is estimated using flow rate inspection device 100; however, it is possible to perform the estimation of the suction nozzle 60 using flow rate inspection device 150. Specifically, after adjusting the adjustment time open flow rate using flow rate inspection device 150, the air flow rates of the reference pipes 120 and 122 may be measured, and the proportionality factor of the air flow rate in relation to the valid sectional areas of reference pipes 120 and 122 calculated based on the measured air flow rates and the valid sectional areas of reference pipes 120 and 122. Thus, it is possible to calculate the valid sectional area of the suction nozzle 60 based on the proportionality factor calculated and the air flow rate of the suction nozzle 60.

In the embodiments described above, the inspection method of the present disclosure is applied to an inspection method of suction nozzle 60 that picks up and holds an electronic component; however, it is possible to apply the inspection method of the present disclosure to the inspection method of a suction nozzle which picks up and holds various target objects.

REFERENCE SIGNS LIST

60: suction nozzle, 102: factory air source (first air source), 118: depressurized air flow path (air flow path), 120: reference pipe, 122: reference pipe, 152: compressor (second air source)

The invention claimed is:

1. An inspection method for inspecting a suction nozzle that picks up a target object using air suction, the method comprising:
 a reference pipe measurement step of measuring an air flow rate per unit time which flows in each of multiple reference pipes that have different sectional areas;
 a proportionality factor calculation step of calculating a proportionality factor between the air flow rates of the reference pipes and sectional areas based on the air flow rate of each of the multiple reference pipes measured in the reference pipe measurement step, and the sectional areas of the multiple reference pipes;
 a suction nozzle measurement step of measuring the air flow rate per unit time that flows in the suction nozzle which is an inspection target;
 a sectional area calculation step of calculating a sectional area of the suction nozzle which is the inspection target based on the air flow rate measured in the suction nozzle measurement step, and the proportionality factor calculated in the proportionality factor calculation step; and
 a determining step for determining whether the suction nozzle which is the inspection target is functioning properly based upon comparing the calculated sectional area of the suction nozzle which is the inspection target and a predetermined sectional area.

2. The inspection method according to claim 1, wherein the suction nozzle is inspected in an environment where an air pressure of an air source used in the inspection method fluctuates.

3. The inspection method according to claim 1, further comprising an adjustment step of adjusting an air pressure of air from an air source used in the inspection method.

4. The inspection method according to claim 3, further comprising a depressurizing step of depressurizing an airflow path used in the inspection method.

5. The inspection method according to claim 1, further comprising a transport step of detaching a tray containing the suction nozzle which is the inspection target from a work machine and accommodating the tray inside a nozzle management device.

6. An inspection method for inspecting a suction nozzle that picks up an object using air suction, the method comprising:

a pressure adjustment step of adjusting a pressure of air supplied from a first air source to a set pressure;

a flow rate adjustment step of adjusting a flow rate per unit time of air that flows inside an air flow path to a set amount using air of a pressure which is adjusted in the pressure adjustment step;

an air source exchanging step of exchanging a first air source for a second air source that has greater pressure fluctuation than the first air source after adjustment of the flow rate of air by the flow rate adjustment step is completed;

a first measurement step of measuring a flow rate per unit time of air that flows inside the air flow path after exchanging of air sources by the air source exchanging step is completed;

a second measurement step of measuring a flow rate per unit time of air which flows inside the air flow path in a state in which a suction nozzle which is an inspection target is connected to the air flow path; and an estimated flow rate calculation step of calculating a value, which is obtained by multiplying the flow rate per unit time measured in the second measurement step by a ratio of the flow rate per unit time measured in the first measurement step to the set amount, as an estimated flow rate.

\* \* \* \* \*